(12) United States Patent
Inaba

(10) Patent No.: US 6,677,970 B1
(45) Date of Patent: Jan. 13, 2004

(54) LIGHT-EMITTING DIODE ARRAY AND OPTICAL PRINT HEAD

(75) Inventor: Masaharu Inaba, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 09/601,346
(22) PCT Filed: Feb. 22, 1999
(86) PCT No.: PCT/JP99/00805
§ 371 (c)(1), (2), (4) Date: Aug. 18, 2000
(87) PCT Pub. No.: WO99/42294
PCT Pub. Date: Aug. 26, 1999

(30) Foreign Application Priority Data

Feb. 20, 1998 (JP) .......................................... H10-39150

(51) Int. Cl.[7] .................................................. B41J 2/45
(52) U.S. Cl. ...................................................... 347/238
(58) Field of Search .............................. 347/238, 244, 347/130; 205/118, 125; 361/761, 762; 174/261; 428/480; 360/245.6

(56) References Cited

U.S. PATENT DOCUMENTS

| | | | | |
|---|---|---|---|---|
| 5,084,714 A | * | 1/1992 | Beaman et al. | 347/244 |
| 5,378,859 A | * | 1/1995 | Shirasaki et al. | 174/261 |
| 5,939,206 A | * | 8/1999 | Kneezel et al. | 428/480 |
| 6,002,548 A | * | 12/1999 | Ohwe et al. | 360/245.6 |

FOREIGN PATENT DOCUMENTS

| | | | | |
|---|---|---|---|---|
| GB | 2 188777 A | * | 10/1987 | H01L/23/50 |
| JP | 59-112638 | * | 6/1984 | H01L/23/48 |
| JP | 61-147560 | * | 7/1986 | H01L/23/48 |
| JP | 63-16471 | | 2/1988 | |
| JP | 5-235412 | | 9/1993 | |
| JP | 7-176565 | * | 7/1995 | H01L/21/60 |
| JP | 7-314772 | | 12/1995 | |
| JP | 8-58151 | * | 3/1996 | B41J/2/44 |

\* cited by examiner

Primary Examiner—Hai Pham
(74) Attorney, Agent, or Firm—Arent Fox Kintner Plotkin & Kahn, PLLC

(57) ABSTRACT

An optical print head has a light-emitting diode array having a density of 600 dpi or higher, but nevertheless permits wire bonding to be performed securely and permits reliable bonding. The light-emitting diode array has a thick-film surface protection film, made of a material of the polyimide family, laid on the surfaces of wiring patterns except on light-emitting regions and on electrode wiring pads (individual electrodes).

15 Claims, 5 Drawing Sheets

PRIOR ART

LIGHT-EMITTING DIODE ARRAY AND OPTICAL PRINT HEAD

TECHNICAL FIELD

The present invention relates to a light-emitting diode array and an optical print head provided with such a light-emitting diode array.

BACKGROUND ART

Conventionally, light-emitting diodes (LEDs) are widely used as display devices for their advantages of emitting clear light, operating from low voltages, needing simple peripheral circuits, and for other reasons.

Nowadays, optical print heads employing light-emitting diode arrays are much studied for the purpose of finding their practical applications as light sources in optical printers or the like based on electrophotography.

In an optical printer employing as a light source a light-emitting diode array, which emits light by itself, the individual dots of the light-emitting diode array are made to emit light in accordance with an image signal, and the thus emitted light is shone, through a unit-magnification imaging device such as a gradient-index lens, onto a photoconductive drum to form an electrostatic latent image thereon. Then, toner is selectively deposited on the photoconductive drum by a developer unit, and the thus deposited toner is transferred onto plane paper or the like, thereby achieving printing.

A print head employing a light-emitting diode array offers advantages of (1) being free of movable parts and composed of a small number of components, and thus capable of being made compact, and (2) permitting as many array chips as required to be connected together so as to be readily formed to have a desired total length.

In a light-emitting diode array having a light-emitting region density of, for example, 600 dpi (dots per inch), the light-emitting regions are arranged with a pitch of 42 to 43 $\mu$m. Thus, considering the width of non-light-emitting regions secured between the light-emitting regions, the width of the light-emitting regions themselves is smaller than that pitch. On the light-emitting regions, electrodes each having a width smaller than 42 to 43 $\mu$m are formed with a pitch of 42 to 43 $\mu$m. These electrodes formed on the light-emitting regions are connected to wiring patterns that are formed to be so fine as to have a width smaller than 42 to 43 $\mu$m each and arranged with a pitch of 42 to 43 $\mu$m or smaller. These wiring patterns are in turn connected to wider bonding electrodes (pads). This light-emitting diode array, having electrodes and wiring formed as described above, needs to be electrically connected, by wire bonding or the like, to, for example, a driving device for driving the light-emitting diode array.

Even stitch bonding, which permits bonding with the smallest width at present, requires a bonding width of 40 $\mu$m, to which it is inevitable to add a further 20 $\mu$m considering the positioning accuracy of bonding equipment. That is, as the width of a bonding electrode, it is necessary to secure about 60 $\mu$m at least.

Accordingly, in a high-density light-emitting diode array having a density of 600 dpi or higher, arranging bonding electrodes in a single row makes wire bonding difficult; for this reason, it is customary to arrange them in a zigzag in two rows to secure a greater electrode pitch. Even then, however, it is possible to secure 60 $\mu$m at best as the width of a bonding electrode. This has recently been making extremely difficult to electrically connect a light-emitting diode array and a driving device for it together by wire bonding.

Conventional light-emitting diodes and light-emitting diode arrays of this type designed for use in optical printers are disclosed, for example, in Japanese Utility Model Application Published No. H7-36754 and Japanese Patent Applications Laid-Open Nos. H5-347430 and H5-155063.

FIG. 4 is a plan view of the light-emitting diode array for use in an optical printer disclosed in the above-mentioned Japanese Utility Model and Patent Applications, and FIG. 5 is a sectional view taken along line A–A' shown in FIG. 4.

In these figures, reference numeral 1 represents a compound semiconductor, made of GaP, GaAsP, GaAlAs, GaAs, or the like, that has a plurality of light-emitting regions 11 formed on the top surface thereof by selective diffusion so as to be arranged in a single row or in a zigzag in two rows. Reference numerals 2, 3, and 4 represent insulating films, made of $Si_3N_4$, $SiO_2$, $AlO_3$, or the like, that are laid over one another on the top surface of the compound semiconductor 1. These insulating layers 2, 3, and 4 are laid in a plurality of layers to serve as the selectively diffused film of the light-emitting regions, as a protective film for protecting the top surface of the compound semiconductor 1, as a pinhole-prevention film, as a wiring-reinforcement/primary-coating film, and as a light-extraction/brightness-adjustment film. Reference numeral 5 represents an electrode layer, made of Al or the like, that is laid over the insulating films 2 and 3 so as to have ohmic contacts with the light-emitting regions and that serves as electrodes connected to the light-emitting regions, as bonding electrodes, and as wiring patterns that connect those electrodes together. Reference numeral 6 represents a common electrode, made of Au or the like, that is laid on the bottom surface of the compound semiconductor 1.

Here, in the case of a high-density light-emitting diode array having a density of 600 dpi or higher, applying wire bonding directly to the bonding electrodes formed on the top surface of the light-emitting diode array causes the following problems.

To obtain a higher wiring density, it is necessary to reduce the width of the wiring patterns that are connected to the bonding electrodes and reduce the intervals between adjacent wiring patterns. However, if they are reduced extremely, when the wiring patterns are deformed by external force that may be applied thereto during the array cleaning or head assembling process, there is the risk of deformed wiring patterns readily making contact with the adjacent wiring patterns. To prevent this, it is necessary to increase the thickness of the protective films that are formed on the individual wiring patterns to prevent corrosion and the like. For example, in a light-emitting diode array having a density of about 300 dpi, forming 0.2 $\mu$m thick inorganic protective films (made of $SiO_2$, SiN, or the like) will suffice; by contrast, in a high-density light-emitting diode array having a density of 600 dpi or higher, such thin films do not provide sufficient protection, and thus a material of the polyimide family is tentatively used as the insulating film 4.

FIGS. 6 to 8 are diagrams illustrating how wire bonding is performed on a light-emitting diode array of which the insulating film 4 is made of, for example, a material of the polyimide family.

As shown in FIG. 6, when the insulating film 4 is made of, for example, a material of the polyimide family, first, a thick-film solution of a material of the polyimide family is spun on the electrode layer 5 to form the insulating film 4 serving as a protective film, and the upper portion of the insulating film 4 is patterned by etching to form openings 4a that permit connection of the wiring patterns. These openings 4a are shaped, for example, as indicated by hatching in FIG. 7, so that comparatively wide connection regions 5a are formed on the electrode layer 5.

Then, as shown in FIG. 8, ball bonding is performed on the connection regions 5a of the electrode layer 5 by using a bonding wire 13 made of gold or the like and dispensed through a capillary 12, and then the thus ball-bonded connection regions 5a are individually connected to the output terminals of the driving device by the bonding wire 13. Alternatively, first, ball bonding is performed on the output terminals of the driving device by using the bonding wire 13, and then the thus ball-bonded output terminals of the driving device are individually connected to the connection regions 5a. In this case, there exist no ball-like portions on the connection regions 5a that are bonded at the second stage of bonding, and therefore, there, the bonding wire 13 needs to be rubbed against the connection regions 5a so as to be deformed and thereby bonded thereto.

However, as shown in FIG. 6, when protection is achieved with a thick film (1 to 2 μm) of a material of the polyimide family, this thick film, lying partially on the connection regions, hampers proper deformation of the bonding wire during bonding, and thus tends to cause insufficient connection. In particular in cases where the bonding wire is bonded to the connection regions at the second stage of bonding, the thick film lying on the connection regions is very likely to act as an obstacle in the height direction and cause imperfect connection. In the worst case, the capillary collides with the thick film, making bonding impossible in the first place. Moreover, insufficient bonding strength increases the risk of wire breakage or the like resulting from the difference in thermal expansion between different metals (usually between Al and Au) or from deterioration with time.

The above description deals with ball bonding, but similar problems are encountered also with stitch bonding that permits high-density connection.

An object of the present invention is to provide a light-emitting diode array, and an optical print head provided with such a light-emitting diode array, that permits wire bonding to be performed securely and thus permits reliable bonding in cases where, for example, resolutions of 600 dpi or higher are required and thus high-density connection by wire bonding is required.

DISCLOSURE OF THE INVENTION

According to a basic feature of the present invention, in a light-emitting diode array having a plurality of light-emitting regions arranged in a row, and having individual electrodes, connected individually by way of wiring patterns to the light-emitting regions, arranged in a plurality of rows, a protective film is laid on the surfaces of the wiring patterns except at least on the individual electrodes.

Here, the protective film may be a thick film formed so as to cover the surfaces of the wiring patterns. Alternatively, the film thickness of the protective film may be equal to or less than the film thickness of the individual electrodes. Alternatively, the protective film may be a thick film made of a material of a polyimide family.

In this way, according to the present invention, a light-emitting diode array, and an optical print head incorporating it, has a protective film laid on the surfaces of wiring patterns except at least on individual electrodes. Accordingly, even in a high-density light-emitting diode array having a density of 600 dpi or higher, it is possible to achieve both satisfactory surface protection of wiring patterns and secure bonding. Thus, it is possible to realize a reliable optical print head.

BEST MODE FOR CARRYING OUT THE INVENTION

Figure 1:
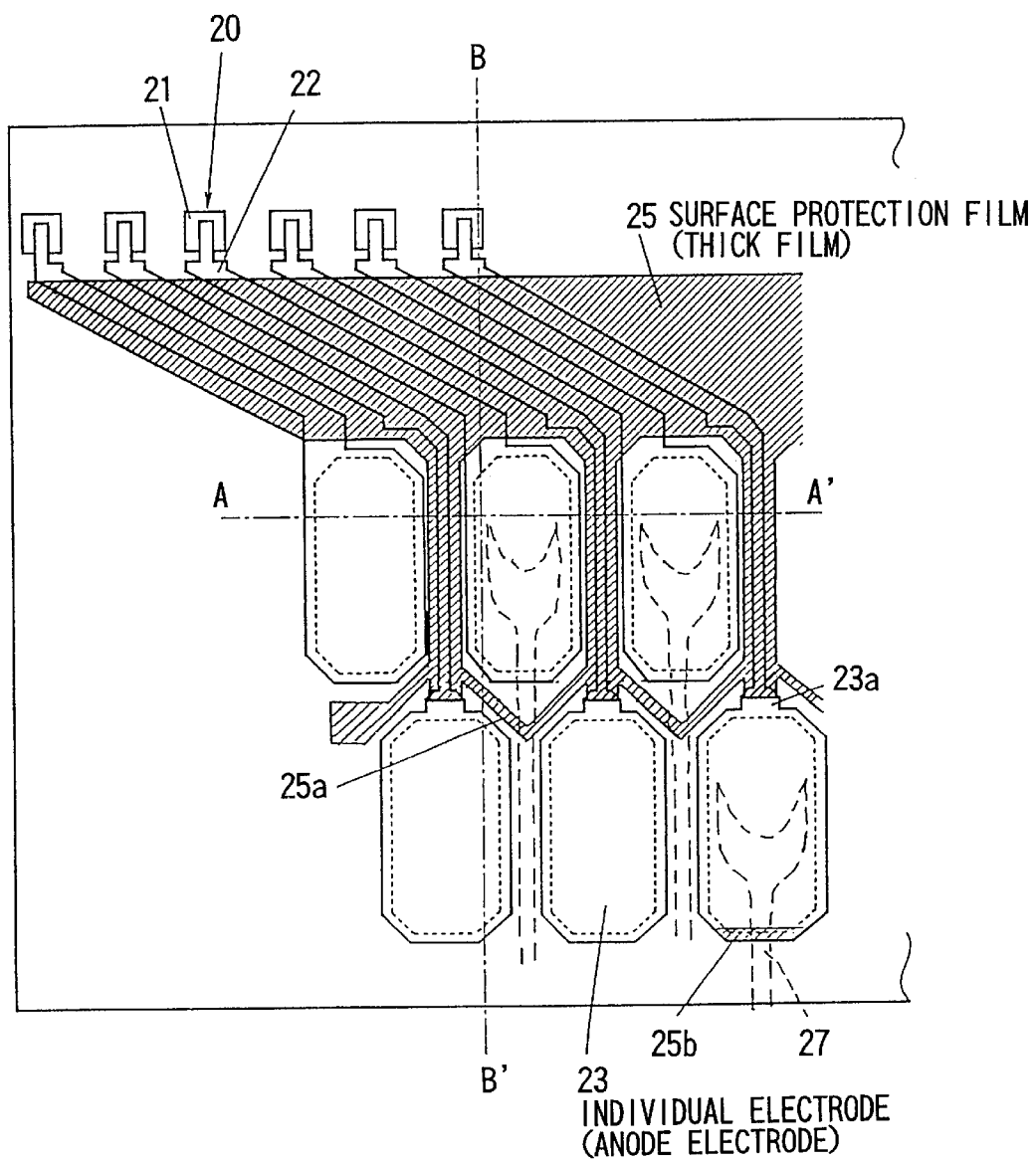
FIG. 1 is a plan view showing the structure of a light-emitting diode array embodying the present invention.

FIG. 1 is a plane view showing the structure of a light-emitting diode array embodying the present invention. This light-emitting diode array has a dot density equivalent to 600 dpi.

Figure 2:
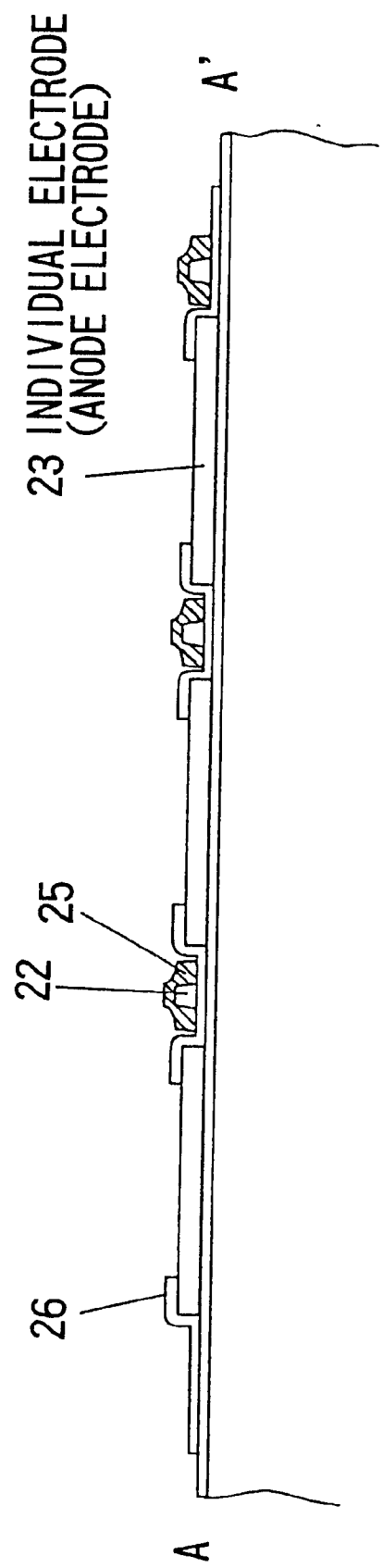
FIG. 2 is a sectional view taken along line A–A' shown in FIG. 1.
Figure 3:
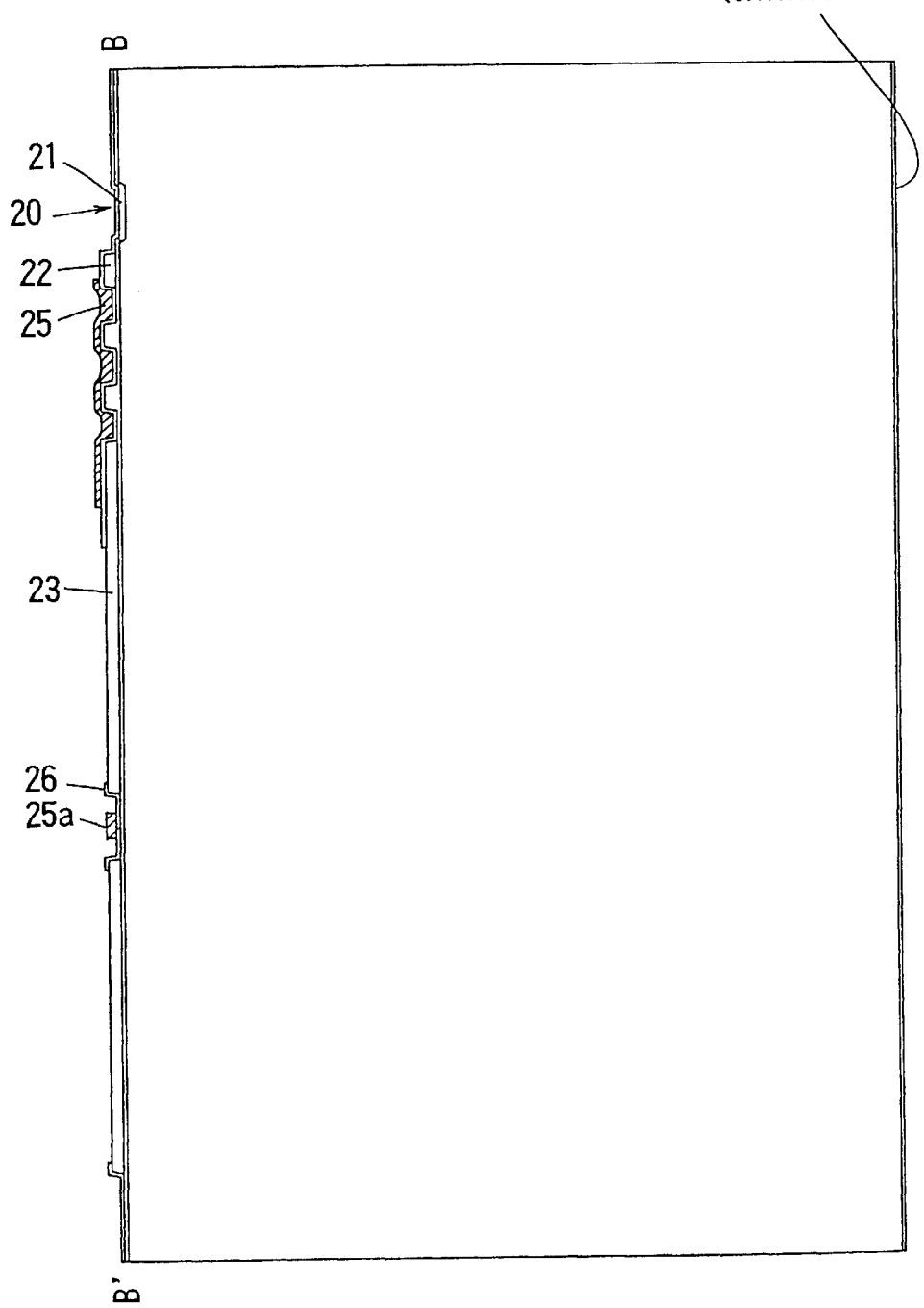
FIG. 3 is a sectional view taken along line B–B' shown in FIG. 1.
Figure 4:
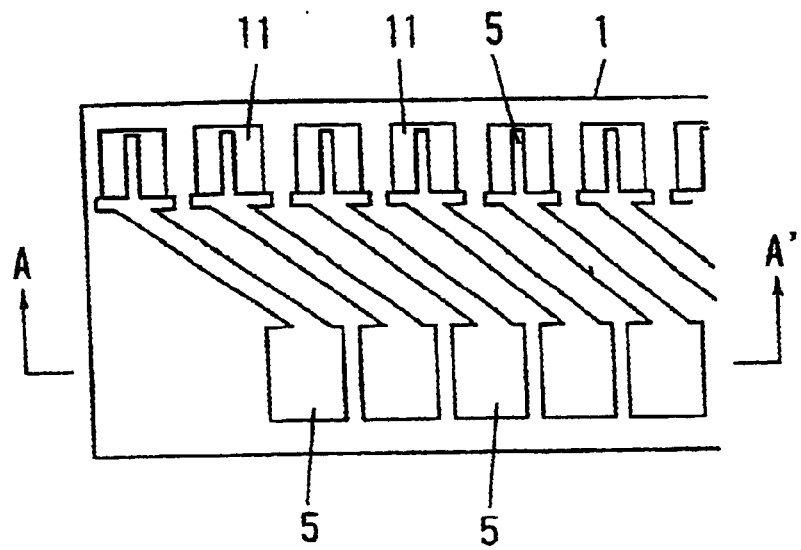
FIG. 4 is a plan view showing a conventional light-emitting diode array for use in an optical printer.
Figure 5:
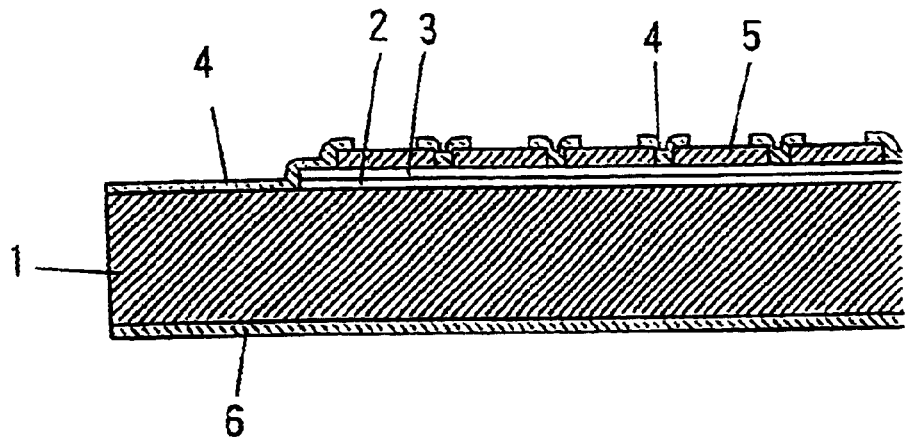
FIG. 5 is a sectional view taken along line A–A' shown in FIG. 4.
Figure 6:
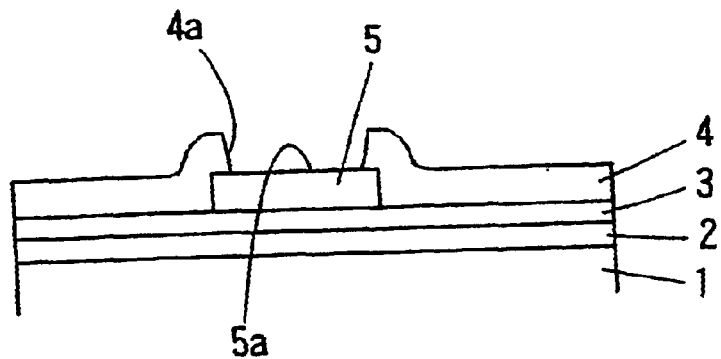
FIG. 6 is a sectional view illustrating how wire bonding is performed in a conventional light-emitting diode array.
Figure 7:
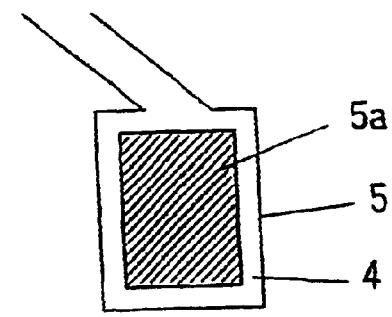
FIG. 7 is a plan view illustrating how wire bonding is performed in a conventional light-emitting diode array.
Figure 8:
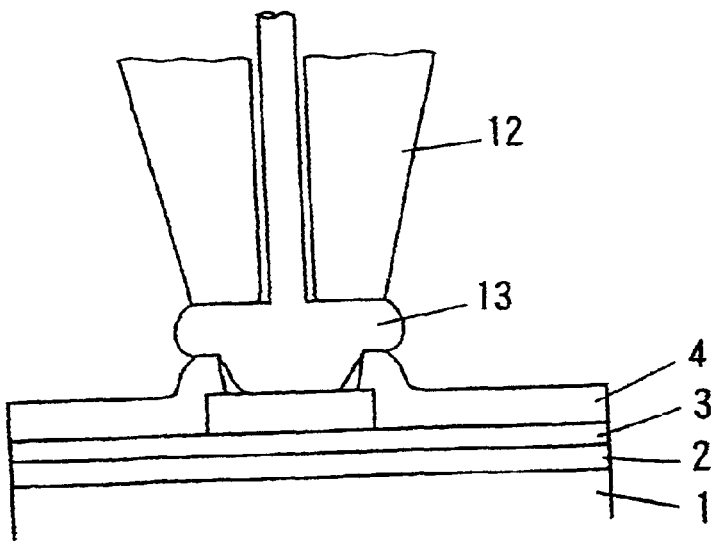
FIG. 8 is a sectional view illustrating how wire bonding is performed in a conventional light-emitting diode array.

FIG. 2 is a sectional view of the light-emitting diode array of FIG. 1 taken along line A–A'. FIG. 3 is a sectional view of the light-emitting diode array of FIG. 1 taken along line B–B'.

In these figures, reference numeral 20 represents the light-emitting diode array, which has a plurality of light-emitting diodes, constituting light-emitting regions 21, integrated thereon and which is made principally of a compound semiconductor such as GaP, GaAsP, GaAlAs, or GaAs. The light-emitting diode array 20 has a plurality of light-emitting regions 21 formed on the top surface thereof by selective diffusion so as to be arranged in a row. These light-emitting regions 21 are arranged with a pitch of 600 dpi (about 42 to 43 μm) so as to form a straight line. When an optical print head is assembled, a plurality of light-emitting diode arrays are arranged with all the light-emitting regions thereof aligned to form a straight line and with regular intervals (42.3 μm) even at the seams between the light-emitting diode arrays.

To the light-emitting regions 21 are connected wiring patterns 22, made of Al or the like, that have ohmic contacts therewith. The wiring patterns 22 are, at the other ends, formed into electrode wiring pads 23 for individual electrodes (anode electrodes) that are arranged in zigzag in two rows. The electrode wiring pads 23 are for wire bonding, have an oblong shape, for example, 60 μm wide and 120 μm long, and have corner portions thereof removed. The electrode wiring pads 23 that are arranged in the driving device side row have, where they connect to the wiring patterns 22, projecting portions 23a that have a greater width than the wiring patterns 22. The electrode wiring pads 23 arranged in the first row and those arranged in the second row are located with an offset of 40.5 μm in the lateral direction and with an offset of 135 μm in the longitudinal direction relative to each other.

Moreover, as shown in FIG. 3, the light-emitting diode array 20 has a common electrode (cathode electrode) 24, made of Au or the like, formed over the entire bottom surface thereof.

In this light-emitting diode array 20, a thick-film surface protection film 25, made of an organic material of the polyimide family, is formed on the surfaces of the wiring patterns 22 except on the light-emitting regions 21 and on the electrode wiring pads 23. In FIG. 1, hatching indicates the area in which the surface protection film 25 is formed. As this hatching shows, the surface protection film 25 is formed so as to cover only the surfaces of the wiring patterns 22 that are formed as extra-fine lines to achieve high-density wiring, and thus the surface protection film 25 does not cover the other area, in particular the electrode wiring pads 23. That is, whereas generally accepted conventional wiring rules dictate that the surfaces of wiring patterns and the edge portions of electrode wiring pads should be protected with a protective film for corrosion prevention and other purposes, this embodiment does not stick to such wiring rules so that the electrode wiring pads 23 are not protected with a thick film but only the surfaces of the wiring patterns 22 that are formed as extra-fine lines to achieve high-density wiring are protected by the surface protection film 25 formed thereon.

The electrode wiring pads 23, not covered with the surface protection film 25, are no longer affected by a thick film lying on the edge portions thereof, and can thus be connected securely to the output terminals (not shown) of the driving device by wire bonding.

Part of the surface protection film 25 lies, as a protective film 25a, on the gaps between the electrode wiring pads 23 arranged in the first row and those arranged in the second row. This protective film 25a serves to prevent the fine metal wires 27 connected by wire bonding to the electrode wiring pads 23 arranged in the first row from making contact with the electrode wiring pads 23 arranged in the second row.

Now, how this light-emitting diode array 20 is manufactured and how it is assembled into an optical print head will be described.

The light-emitting diode array 20 is made of a compound semiconductor such as GaP, GaAsP, GaAlAs, or GaAs. On its top surface, the light-emitting diode array 20 has a plurality of light-emitting regions 21 arranged in a row, and has wiring patterns 22, made of Al or the like, having ohmic contacts with the light-emitting regions 21. These wiring patterns 22 are, at the other ends, formed into electrode wiring pads 23 for individual electrodes (anode electrodes) that are arranged in zigzag in two rows.

Moreover, as shown in FIG. 3, the light-emitting diode array 20 has a common electrode (cathode electrode) 24, made of Au or the like, formed on the bottom surface thereof.

In this state, a thick-film solution of a material of the polyimide family is spun on the surface of the light-emitting diode array 20 including the wiring patterns 22 and the electrode wiring pads 23 to form a thick-film surface protection film 25 having a thickness of about 1 $\mu$m.

Next, this surface protection film 25 is etched by using a mask pattern (a resist film) having the shape of the hatched portion in FIG. 1, and then the resist film is removed. Now, the thick-film surface protection film 25 of a material of the polyimide family lies only on the surfaces of the wiring patterns 22 except on the light-emitting regions 21 and on the electrode wiring pads 23.

In this way, as shown with hatching in FIG. 1, the surface protection film 25 is formed so as to cover only the surfaces of the wiring patterns 22 that are formed as extra-fine lines to achieve high-density wiring. That is, the surface protection film 25 is not formed on the electrode wiring pads 23 nor on the surfaces of the light-emitting regions 21.

The thick-film surface protection film 25 is required for the protection of the wiring patterns 22 that are formed as extra-fine lines to achieve high-density wiring, and in particular for the protection of the wiring patters 22 that are laid between the electrode wiring pads arranged in the first row so as to be connected to the electrode wiring pads arranged in the second row. That is, the intended purpose is accomplished if only these high-density, extra-fine wiring patterns are protected, and therefore the surface protection film 25 is formed so as to cover only the surfaces of the wiring patterns 22 and not the electrode wiring pads 23.

Next, the electrode wiring pads 23, serving as individual electrodes, are electrically connected to the corresponding output terminals of the driving device (not shown) by wire bonding using a fine metal wire (bonding wire) 27 such as a gold wire. The surface protection film (thick film) 25 does not lie on the electrode wiring pads 23, nowhere over the entire connection regions thereof including edge portions. Accordingly, even if bonding is performed on the driving device at the first stage of bonding and then on the electrode wiring pads 23 by bonding the fine metal wire 27 to the connection regions thereof at the second stage of bonding, it does not occur that a thick-film lying on the connection regions acts as an obstacle in the height direction and causes imperfect connection. Thus, it is possible to obtain sufficient bonding strength and thereby realize a highly reliable optical print head.

That the surface protection film 25 does not lie on the electrode wiring pads 23 means that the surfaces of the electrode wiring pads 23 are not protected against corrosion and the like. However, the electrode wiring pads 23 are, for example, 60 $\mu$m wide and 120 $\mu$m long, and thus have a far larger area relative to the width of the high-density wiring patterns 22 (several micrometers at the narrowest portions thereof). Thus, even if a certain degree of corrosion develops on the surface of the electrode wiring pads 23, it usually does not cause serious problems.

Even then, corrosion of the electrode wiring pads 23 may be prevented by (1) applying varnish to the electrode wiring pads 23, or by (2) forming a thin film for corrosion prevention thereon. In either way, it is possible to prevent corrosion on the electrode wiring pads 23 and obtain higher reliability. In this embodiment, a thin film for corrosion prevention is formed according to (2) above. In FIGS. 2 and 3, a corrosion-prevention coating film 26 is shown that is formed for this purpose. In this case, in contrast to the thick-film surface protection film 25 made of a material of the polyimide family, the corrosion-prevention coating film 26 is a thin film that serves to prevent corrosion, and can thus be formed simply as a thin inorganic film made of silicon nitride ($Si_3N_4$), silicon oxide ($SiO_2$), or the like. An inorganic film like this, made of silicon nitride, silicon oxide; or the like, is necessary also for another purpose of coating, as a light-extraction/brightness-adjustment film, the light-emitting regions 21. Therefore, in this embodiment, a coating film of silicon nitride is formed to serve the two purposes mentioned above.

As described above, in the optical print head of this embodiment, the light-emitting diode array has a thick-film surface protection film 25, made of a material of the polyimide family, formed so as to cover the surfaces of the wiring patterns 22 except on the light-emitting regions 21 and on the electrode wiring pads 23 (individual electrodes).

This makes it possible to form on the surfaces of the wiring patterns 22 a protective film thick enough to protect high-density wiring so that the wiring patterns 22 are effectively protected (from deformation caused by external force applied thereto, and from short-circuiting resulting from such deformation). Moreover, when the electrode wiring pads 23 are connected to the driving device by wire bonding, there is no obstacle in the height direction on the surface protection film 25. This makes it possible to obtain sufficient bonding strength and thereby realize a highly reliable optical print head.

Moreover, what is additionally needed here is simply to change the shape of the mask used to form the surface protection film. That is, as compared with conventional examples, this embodiment requires no extra member or manufacturing process, and thus can be practiced easily and readily.

Accordingly, the structure of the light-emitting diode array of this embodiment permits the electrode wiring pads to be arranged in such a way that their connection can be coped with by the currently available wire bonding techniques, and thus makes it possible to realize a high-density optical print head having a density of 600 dpi or higher.

In the light-emitting diode array of this embodiment, the surface protection film 25 is formed so as to cover the surfaces of the wiring patterns 22. However, the surface protection film 25 may be formed in any other manner as long as it covers the surfaces of the wiring patterns 22 except on the electrode wiring pads (individual electrodes) 23, more precisely as long as sufficiently wide connection regions to permit bonding can be secured. For example, as shown in FIG. 1, the electrode wiring pads 23 arranged in the driving device side row have, where they connect to the wiring patterns 22, projecting portions 23a to reinforce the wiring patterns 22, and the surface protection film 25 is formed to cover half of the area of those projecting portions 23a.

Moreover, in this embodiment, the surface protection film 25 is formed on the surfaces of the wiring patterns 22 except on the electrode wiring pads (individual electrodes) 23, and the same effects as obtained in this embodiment can be obtained even if the film thickness of the surface protection film 25 is smaller than the film thickness of the individual electrodes.

Basically, the minimum requirement is that, on the electrode wiring pads (individual electrodes) 23, the surface protection film 25 be formed with so small a film thickness as not to hamper bonding. That is, since the electrode wiring pads 23 tend to have smaller widths as optical print heads are given higher densities (resolutions), if the surface protection film 25 is formed to lie on the width-direction edges of the electrode wiring pads (i.e. the edges thereof that are located in the direction in which the electrode wiring pads 23 are arranged), it hampers bonding as described above. Accordingly, it is not preferable to form the surface protection film 25 to lie on the width-direction edges of the electrode wiring pads 23. On the other hand, the length of the electrode wiring pads 23 can be set comparatively freely irrespective of whether the density (resolution) of the optical print head is high or not. Accordingly, as long as the electrode wiring pads 23 have an oblong shape, with the length thereof set to be so short as not to hamper bonding as described above, the surface protection film may be formed to lie, as indicated by reference numeral 25b in FIG. 1, on the length-direction edges of the electrode wiring pads 23 (i.e. the edges thereof that are located in the direction perpendicular to the direction in which the electrode wiring pads 23 are arranged).

That is, as conventionally practiced, the surface protection film 25 is formed so as to cover only the edge portions of the electrode wiring pads 23, with the surfaces of the electrode wiring pads 23 mostly exposed. Here, if the electrode wiring pads 23 are oblong, the surface protection film 25 may be formed with portions thereof that lie on the width-direction edges of the electrode wiring pads 23 removed but with portions 25b thereof that lie on the length-direction edges of the electrode wiring pads 23 left intact. In this way, if the surface protection film 25 is formed so as to lie, within the surface of each electrode wiring pad 23, only on the length-direction edges, in particular, as indicated by reference numeral 25b, only in that edge that perspectively overlaps the fine metal wire 27, just as with the portion 25a of the surface protective film, even when the metal fine wire 27 wire-bonded along the length of the electrode wiring pads 23 sags, the portion 25b of the surface protective film supports the sagging portion of the fine metal wire 27 and thereby prevents contact (short-circuiting) of the fine metal wire 27b with the adjacent electrode wiring pads 23.

The surface protection film is typically made of polyimide. However, the surface protection film may be made of any material, for example a silicon compound with an organic binder added thereto, as long as it is free of cracking even when formed into a thick film having a thickness of about 1 $\mu$m or more.

In this embodiment, a coating film (the corrosion-prevention coating film 26) of silicon nitride is formed to prevent corrosion of the individual electrodes. Here, this thin film is made of silicon nitride because it serves also as an anti-reflection film for the light-emitting regions. As a thin-film surface protection film, it is also possible to use a film of silicon oxide. However, it is preferable to use a film of silicon nitride because it offers a higher refractive index and thus a greater anti-reflection effect than a film of silicon oxide, and in addition it is highly hydrophobic and thus highly reliable.

This embodiment deals with a light-emitting diode array having a density equivalent to 600 dpi. However, the present invention is applicable also to light-emitting diode arrays having higher densities, for example 1,200 dpi.

This embodiment deals with boll bonding that achieves bonding between different metals (usually between Al and Au). However, the present invention offers the same advantages also in cases where supersonic bonding is used that permits high-density connection.

The optical print head of this embodiment may be constructed in any manner as long as it includes the structure described above; that is, its manufacturing process, the type of the substrate used therein, the number and size of electrodes and others included therein, and the configuration of their arrangement, such as the number of rows and the shape in which they are arranged, may be otherwise than is specifically described above in connection with the embodiment.

Industrial Applicability

As described above, a light-emitting diode array and an optical print head embodying the present invention are useful in realizing a light-emitting diode array having a density of 600 dpi or higher that requires high-density wiring and wire bonding and in realizing an optical print head provided with such a light-emitting diode array.

What is claimed is:

1. A light-emitting diode array having a plurality of light-emitting regions arranged in a row, and having oblong individual electrodes that have short sides and long sides thereof arranged respectively parallel to and perpendicular to a direction in which the light-emitting regions are arranged and that are bonded at a second stage of a ball bonding process, connected individually by way of wiring patterns to the light-emitting regions, arranged in at least two rows along the direction in which the light-emitting regions are arranged,
   wherein a protective film is laid on surfaces of the wiring patterns and without being laid upon the individual electrodes,
   part of the protective film lies on gaps between the rows of electrodes arranged along the direction in which the light-emitting regions are arranged, and
   part of the protective film lies partially on gaps between the individual electrodes arranged in an identical row, the row arranged farthest from the light-emitting region and having no wiring patterns between the individual electrodes.

2. A light-emitting diode array as claimed in claim 1, wherein the protective film is a thick film formed so as to cover the surfaces of the wiring patterns.

3. A light-emitting diode array as claimed in claim 1, wherein the film thickness of the protective film is equal to or less than film thickness of the individual electrodes.

4. A light-emitting diode array as claimed in claim 1, wherein the protective film is a thick film made of a material of a polyimide family.

5. A light-emitting diode array having a plurality of light-emitting regions arranged in a row, and having oblong individual electrodes that have short sides and long sides thereof arranged respectively parallel to and perpendicular to a direction in which the light-emitting regions are arranged and are bonded at a second stage of a ball bonding process, connected individually by way of wiring patterns to the light-emitting regions, arranged in a plurality of rows,
   wherein a protective film is laid on surfaces of the wiring patterns in such a way that surfaces of the individual electrodes are mostly exposed, and portions of the protective film lying on long-side edges of the oblong individual electrodes are removed,
   whereas portions of the protective film are laid on short-side edges of the oblong individual electrodes.

6. An optical print head having a light-emitting diode array, a driving device for driving a light-emitting diode array, and a fine metal wire for electrically connecting the light-emitting diode array and the driving device together by bonding,
   wherein, as the light-emitting diode array, a light-emitting diode array as claimed in claim 5 is used.

7. An optical print head having a light-emitting diode array, a driving device for driving the light-emitting diode array, and a fine metal wire for electrically connecting the light-emitting diode array and the driving device together by bonding, the fine metal wire being bonded to the driving device at a first stage of bonding and bonded to the light-emitting diode array at a second stage of bonding,
   wherein, as the light-emitting diode array, a light-emitting diode array as claimed in claim 5 is used.

8. A light-emitting diode array having a plurality of light-emitting regions arranged in a row, and having oblong individual electrodes that have short sides and long sides thereof arranged respectively parallel to and perpendicular to a direction in which the light-emitting regions are arranged and are bonded at a second stage of a ball bonding process, connected individually by way of wiring patterns to the light-emitting regions, arranged in a plurality of rows along the direction in which the light-emitting regions are arranged,
   wherein a protective film is laid on surfaces of the wiring patterns in such a way that surfaces of the individual electrodes are mostly exposed,
   portions of the protective film lying on long-side edges of the oblong individual electrodes are removed,
   whereas portions of the protective film are laid on short-side edges of the oblong individual electrodes,
   part of the protective film lies on gaps between the rows of electrodes arranged along the direction in which the light-emitting regions are arranged, and
   part of the protective film lies partially on gaps between the individual electrodes arranged in an identical row, the row arranged farthest from the light-emitting regions and having no wiring patterns between the individual electrodes.

9. A light-emitting diode array having a density of 600 dpi or higher and a plurality of light-emitting regions arranged in a row, and having oblong individual electrodes that have short sides and long sides which are substantially twice a length of the short sides, the individual electrodes are arranged respectively parallel to and perpendicular to a direction in which the light-emitting regions are arranged and connected individually by way of wiring patterns to the light-emitting regions, arranged in a plurality of rows,
   wherein a protective film is laid on surfaces of the wiring patterns without being laid upon the individual electrodes,
   part of the protective film lies on gaps between the rows of electrodes arranged along the direction in which the light-emitting regions are arranged, and
   part of the protective film lies partially on gaps between the individual electrodes arranged in an identical row, the row arranged farthest from the light-emitting regions and having no wiring patterns between the individual electrodes.

10. A light-emitting diode array comprising:
   a plurality of light-emitting regions arranged in a row;
   oblong individual electrodes having short sides and long sides thereof arranged respectively parallel to and perpendicular to a direction in which the light-emitting regions are arranged and bonded at a second stage of a ball bonding process, connected individually by way of wiring patterns to the light-emitting regions, arranged in at least two rows along the direction in which the light-emitting regions are arranged; and
   a thin corrosive-prevention coating film laid on the light-emitting regions and edge portions of the individual electrodes,
   wherein a protective film is laid on surfaces of the wiring patterns and without being laid upon individual electrodes,
   part of the protective film lies on gaps between the rows of electrodes arranged along the direction in which the light-emitting regions are arranged, and
   part of the protective film lies partially on gaps between the individual electrodes arranged in an identical row, the row arranged farthest from the light-emitting regions and having no wiring patterns between the individual electrodes.

11. A light-emitting diode array as claimed in claim 10, wherein the protective film is a thick film formed so as to cover the surfaces of the wiring patterns.

12. A light-emitting diode array as claimed in claim 10, wherein film thickness of the protective film is equal to or less than film thickness of the individual electrodes.

13. A light-emitting diode array as claimed in claim 10, wherein the protective film is a thick film made of a material of a polyimide family.

14. A light-emitting diode array as claimed in claim 10, wherein the corrosive-prevention coating film is a thin film made of silicon nitride.

15. A light-emitting diode array comprising:

a plurality of light-emitting regions arranged in a row;

oblong individual electrodes having short sides and long sides thereof arranged respectively parallel to and perpendicular to a direction in which the light-emitting regions are arranged and bonded at a second stage of a ball bonding process, connected individually by way of wiring patterns to the light-emitting regions, arranged in a plurality of rows along the direction in which the light-emitting regions are arranged;

a thin corrosion-prevention coating film laid on the light-emitting regions and edge portions of the individual electrodes;

a first protective film laid on surfaces of the wiring patterns in such a way that surfaces of the individual electrodes are mostly exposed, part of the first protective film lies on gaps between the rows of electrodes arranged along the direction in which the light-emitting regions are arranged, and part of the first protective film lies partially on gaps between the individual electrodes arranged in an identical row arranged farthest from the light-emitting regions and having no wiring patterns between the individual electrodes; and a second protective film laid on an edge of the short side, opposite to the light-emitting regions, of the oblong individual electrodes arranged in a row situated farthest from the light-emitting regions.

* * * * *